United States Patent [19]

Martin

[11] Patent Number: 5,796,283
[45] Date of Patent: Aug. 18, 1998

[54] BINMOS LATCH CIRCUIT WITH SYMMETRIC SET-UP TIMES

[75] Inventor: Brian Clark Martin, Encinitas, Calif.

[73] Assignee: Philips Electronics North America Corporation, New York, N.Y.

[21] Appl. No.: 731,621

[22] Filed: Oct. 15, 1996

[51] Int. Cl.[6] .......................... H03K 19/00; H03K 3/286
[52] U.S. Cl. .......................... 327/218; 327/198; 327/207
[58] Field of Search .......................... 327/207, 199, 327/200–203, 210–212, 214, 215, 218, 219, 142, 198, 170, 185, 155, 432, 433

[56] References Cited

U.S. PATENT DOCUMENTS 5,081,377  1/1992  Freyman ............................ 327/198
5,362,998  11/1994  Iwamura et al. .................... 327/208

*Primary Examiner*—Timothy P. Callahan
*Assistant Examiner*—Eunja Shin

[57] ABSTRACT

A latch circuit comprises a series arrangement of a clock-controlled three-state driver and a clock-controlled latch between a data input and a data output. A bipolar transistor between the driver and the latch has a base connected to driver output, an emitter connected to the latch, and a collector connected to Vcc. A clock controlled and data input controlled discharge path connects the emitter to ground. A clock-controlled feedback path connects the data output to the base of the bipolar transistor. This configuration combines the driving capabilities of BiCMOS circuitry and the transition-independent set-up times of a conventional CMOS latch.

3 Claims, 4 Drawing Sheets

BINMOS LATCH CIRCUIT WITH SYMMETRIC SET-UP TIMES

FIELD OF THE INVENTION

The invention relates to an electronic circuit with a latch. The latch has substantially similar set-up times for high-to-low transitions as for low-to-high transitions.

BACKGROUND ART

A latch is a memory circuit for the storage of a single data bit under clock signal control. When the clock signal has a first logic value, the latch is opened to assume the state representative of a new data bit. When the clock signal has a second, opposite, logic value, the latch is closed and disconnected from an input of the latch receiving the data bit. The set-up time of the latch is defined as the time necessary that a change in the data bit precedes a change in the clock signal from the first to the second logic value, in order that the change be validly reflected at outputs of the latch. The well-known CMOS latch has symmetric set-up times, i.e., substantially equal for high-to-low and low-to-high input signals transitions.

It is known to reduce the propagation time from input to output of the CMOS latch by replacing its opening portion by a BiNMOS three-state buffer. The BiNMOS buffer comprises a clock-controlled NOR gate driving a bipolar transistor. A disadvantage of this configuration is that the set-up time of the input low-to-high transitions is caused to be significantly shorter than the set-up time of the input high-to-low transitions. This could lead to incorrect signal processing.

OBJECT OF THE INVENTION

It is an object of the invention to provide a latch in BiCMOS technology that has substantially similar set-up times for high-to-low and low-to-high transitions.

SUMMARY OF THE INVENTION

To this end, the invention provides an electronic circuit comprising a data input and a data output; a clock-controlled latch connected to the data output; a clock-controlled three-state driver having a driver input connected to the data input and a driver output; a bipolar transistor having a base connected to driver output, an emitter connected to the latch for driving the latch, and a collector connected to a first supply voltage node; a discharge path arranged between the emitter and a second supply voltage node and under combined clock and data input control; and a clock-controlled feedback path from the data output to a base of the bipolar transistor.

The three-state driver prevents the base from being discharged when the driver has a floating output. The feedback prevents the base of the bipolar transistor from floating. This restores the symmetry for the set-up times of the high-to-low and low- to-high transitions.

BRIEF DESCRIPTION OF THE DRAWINGS

The invention is explained in further detail and by way of example with reference to the accompanying drawings, wherein.

Throughout the figures, same reference numerals indicate similar or corresponding features.

DETAILED EMBODIMENTS

Conventional clock-controlled CMOS latch

Figure 1:
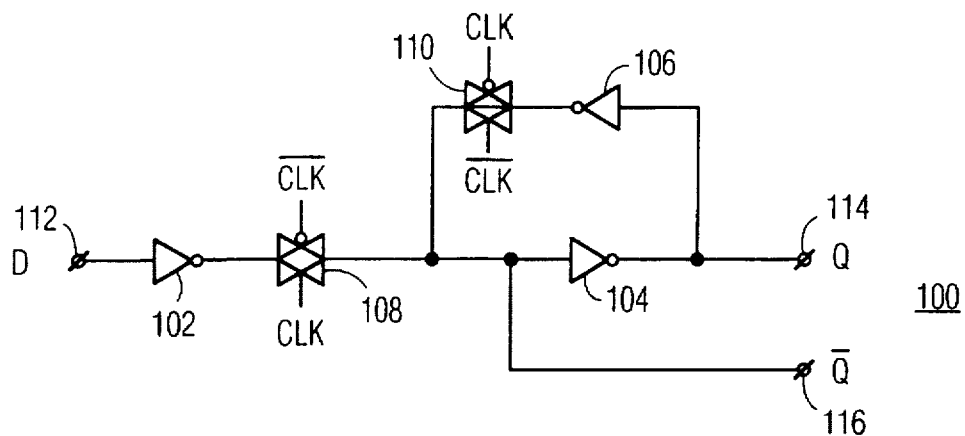
FIG. 1 is a diagram of a conventional clock-controlled CMOS latch.

FIG. 1 is a diagram of a conventional clock-controlled CMOS latch 100. Latch 100 comprises inverters 102, 104 and 106, clock-controlled pass-gates 108 and 110, a data input 112, data output 114 and a data-bar output 116. Inverter 102 has an input connected to data input 112, and has an output coupled to an input of inverter 104 via pass-gate 108. Inverter 104 has an output connected to data output 114. Inverter 106 has an input connected to data output 114, and an output coupled to the input of inverter 104 and data-bar output 116 via pass-gate 110. Inverter 102 and pass-gate 108 are functionally a three-state driver.

When clock signal CLK is high, pass-gate 108 is conducting, and pass-gate 110 is blocking. Then, inverter 102 drives data-bar output 116 with the logic inverse of the data bit at data input 112. When CLK goes low, pass-gates 108 is turned off and pass-gate 110 is turned on. Inverter 106 and inverter 104 now are cross-coupled to perform the latch function. Inverter 106 drives data-bar output 116.

Timing diagrams for the circuit of FIG. 1

Figure 2:
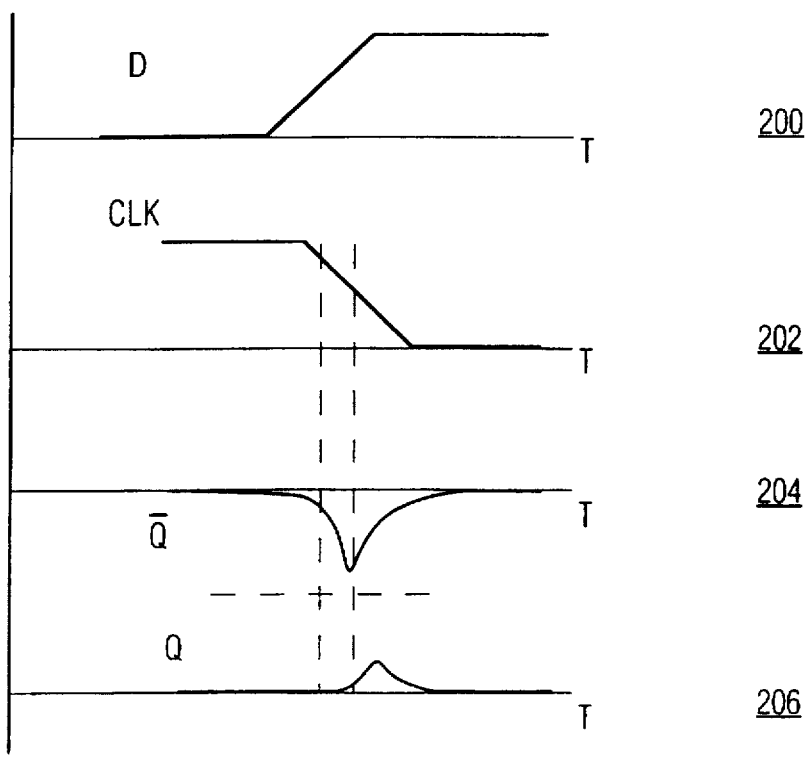
FIG. 2 is a set of timing diagrams showing the set-up times for the circuit of FIG. 1.

The set-up time for latch 100 is defined as the time necessary that a change in data at input 112 precedes a CLK high-to-low transition in order that the change be reflected in output 114 and 116. FIG. 2 is a set of timing diagrams 200, 202, 204 and 206 to explain the consequences of an inadequate set-up time for latch 100. Diagram 200 is a plot of the potential of the data D at input 112 versus time T. Diagram 202 is a plot of the potential of the clock signal CLK versus time T. Diagram 204 is a plot of the potential of signal Q-bar at output 116 versus time T. Diagram 206 is a plot of the potential of signal Q at output 114 versus time T.

The example illustrates what happens if CLK goes low in less than the set-up time after D started to change. Signal Q-bar makes about 70% of a high-to-low transition, causing signal Q to make about 30% of a low-to-high transition, before both signals return to their previous levels. This is consequence of the following. Signal CLK changes the primary conducting path from pass-gate 108 to pass-gate 110, while the output of inverter 106 has not changed yet, due to the glitch in signal Q at output 114. This would have helped to restore signal Q-bar at output 116. Since clock signal CLK and its inverse CLK-bar do not change instantly, there is a period of time, in which inverter 102 and inverter 106 contest in driving output 116. Further, inverter 102 is not driving at its maximum strength because input signal D at input 112 has not completed its transition. If the set-up requirement is met, inverter 102 will have sufficient time to switch inverter 104 so that inverter 106 in turn is likewise. If there is not sufficient time, inverter 106 will switch signal Q-bar at output 116 back as is shown in diagram 204.

Since latch 100 is a symmetric circuit, there should be no substantial differences in the set-up times between input high-to-low and low-to-high transitions.

Known BiCMOS latch circuit

In many designs of latch circuits, the object is to minimize the time from the input 102 to the outputs 114 and 116.

Figure 3:
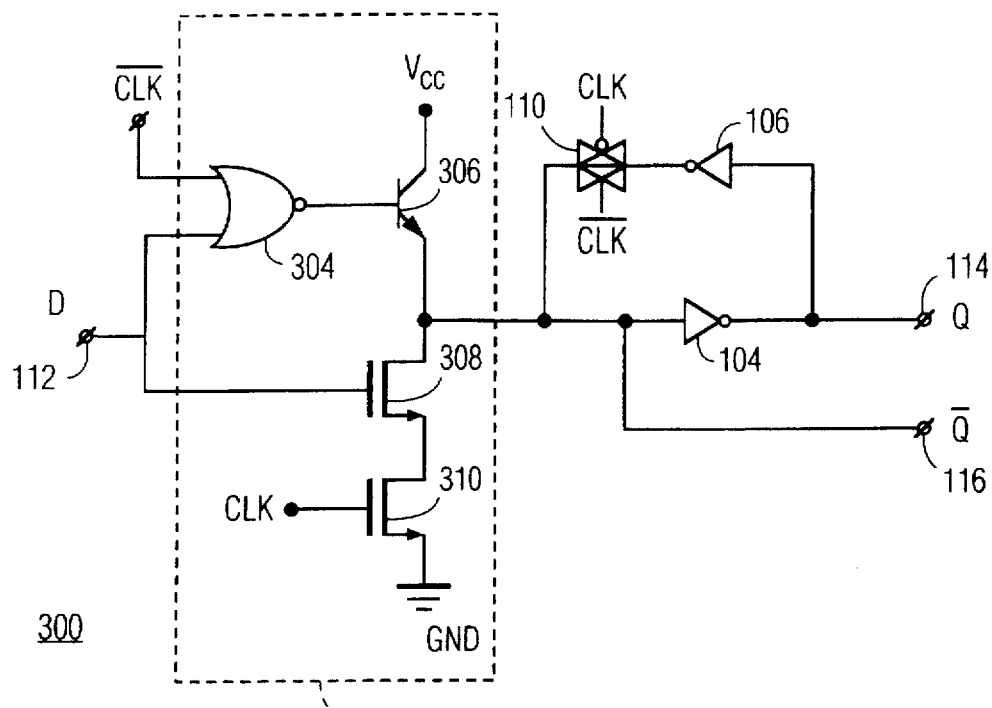
FIG. 3 is a diagram of a known BiCMOS latch circuit having opposite-edge set-up skew.

FIG. 3 is a diagram of a known BiCMOS latch circuit 300 that exhibits generally improved performance. With regard to circuit 100, the three-state driver composed of inverter 102 and pass-gate 108 has been replaced by a BiNMOS driver 302. Driver 302 comprises a NOR gate 304, a bipolar transistor 306, and two NFETs 308 and 310. Transistor 306 has a collector connected to a supply voltage Vdd. Transistors 306, 308 and 310 have their main current paths connected in series between Vdd and GND. NOR gate 304 receives signal CLK-bar and data signal D at data input 112, and drives the base of transistor 306. NFETs 308 and 310 form a discharge path that is under combined control of data signal D and clock signal CLK.

A disadvantage of prior art circuit 300 is the substantial difference in set-up times between the input high-to-low and low-to-high transitions. NFET 308 can influence the potential of signal Q-bar for a substantial portion of the CLK high-to-low transition. This due to the fact that NFET 310 is still partially conducting until signal CLK is less than an NFET threshold. A very small increase in signal CLK-bar, however, can turn off transistor 306 completely, since a small increase in CLK-bar can significantly lower the threshold of NOR gate 304, causing a mid-range input signal D at input 112 to be interpreted as a logic high instead of a logic low. With transistor 306 turned off completely, the partially on NFETs 308 and 310 will pull down the level of signal Q-bar at output 116. Consequently, the set-up time for an input low-to-high transition is much shorter than the set-up time for an input high-to-low transition.

First embodiment of a circuit of the invention

Figure 4:
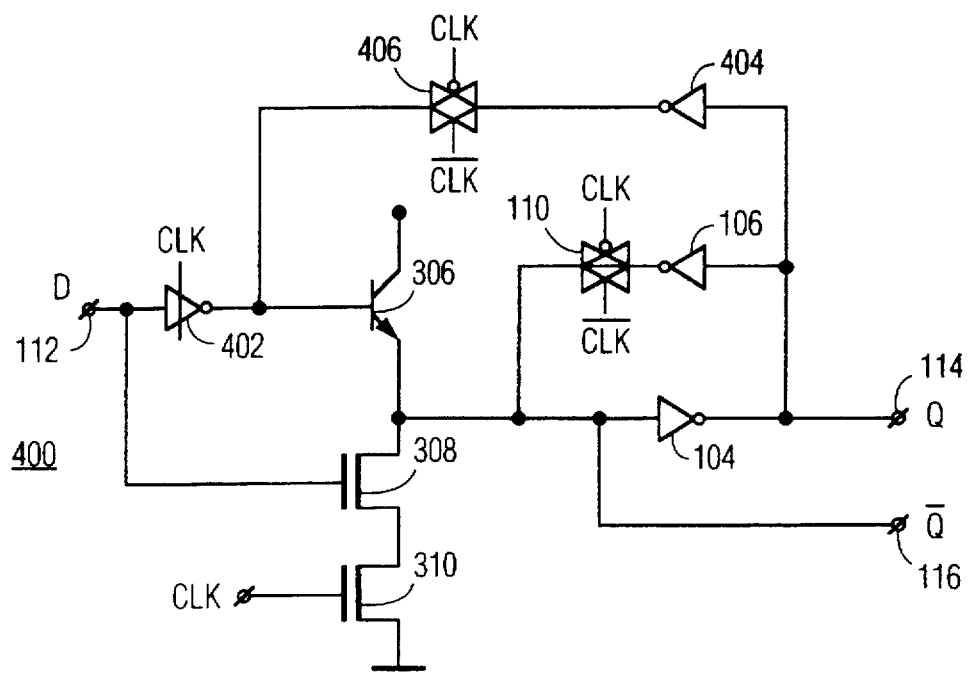
FIG. 4 is a diagram of a first embodiment of a circuit according to the invention.

FIG. 4 is a diagram of a first embodiment of a latch circuit 400 in the invention to eliminate the opposite-edge set-up time skew. With regard to circuit 300 in FIG. 3, NOR gate 304 is replaced by a three-state driver 402, here represented by the symbol for a general type three-state driver. In addition, there is provided a feedback path from output 114 to the base of transistor 306, comprising a feedback inverter 404 and a clock-controlled pass-gate 406. When clock signal CLK goes low, three-state buffer 402 assumes a high-impedance state, i.e., a three state. Note that in circuit 300, a low CLK caused the base of transistor 306 to be discharged. Now, in circuit 400, the outputs of driver 402 and of feedback inverter 404 can contest during a CLK transition in a manner similar to that in which 102 and 106 contested in circuit 100. Also, the feedback from output 114 through a combination of feedback inverter 404 and pass-gate 406 ensures that the base of transistor 306 will not float. These measures restore the symmetry while retaining the BiNMOS input.

Second embodiment of a circuit of the invention

Figure 5:
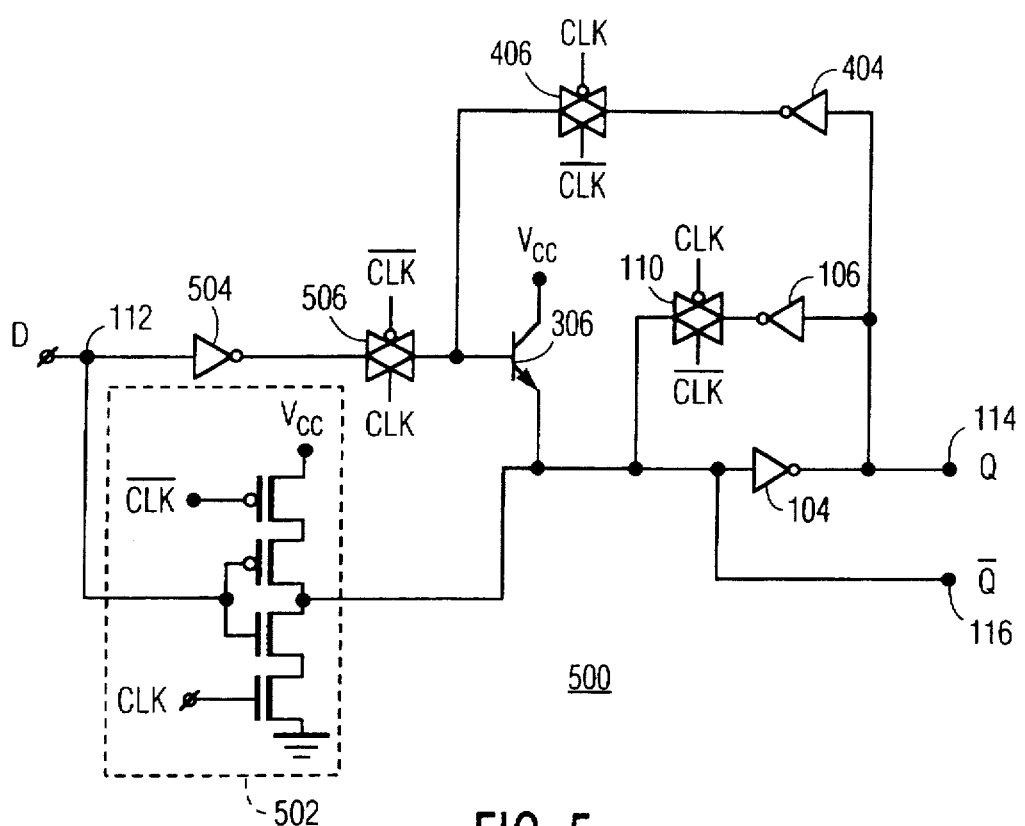
FIG. 5 is a diagram of a second embodiment of a circuit according to the invention.

FIG. 5 is a diagram of a second embodiment of a latch circuit 500 in the invention to eliminate the opposite-edge set-up time skew. With regard to circuit 400, the discharge path formed by NFETs 308 and 310 is now functionally merged with a three-state buffer 502. Three-state buffer 402 is implemented using a series arrangement of an inverter 504 and a pass-gate 506.

Detailed implementations

Figure 6:
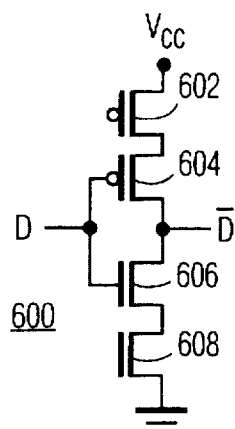
FIGS. 6, 7, 8 and 9 give details of various possible implementations.
Figure 7:
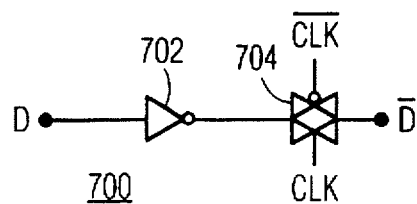
Figure 8:
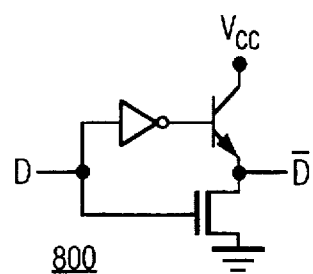
Figure 9:
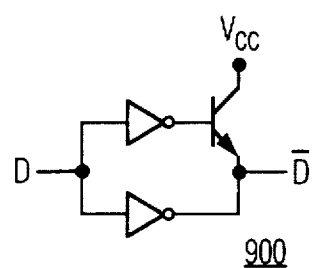

Drivers 402 and 502 could be, for example, a stack 600 of FIG. 6, including a series arrangement of main current channels of PFETs 602 and 604 and NFETs 606 and 608 between Vcc and ground, or a combination 700 of an inverter 702 and a pass gate 704 shown in FIG. 7. A combination of inverter and pass gate, such as, e.g., combination 106/110 or 404/406, could also be implemented by stack 600 or general three-state driver 402. An inverter, e.g., inverter 106 or 404, could be implemented as a CMOS inverter, a BiCMOS inverter 800 or 900 shown in FIGS. 8 and 9.

I claim:

1. An electronic circuit comprising:

a data input and a data output;

a clock-controlled latch connected to the data output;

a clock-controlled three-state driver having a driver input connected to the data input, and a driver output;

a bipolar transistor having a base connected to the driver output, an emitter connected to the latch for driving the latch, and a collector connected to a first supply voltage node;

a clock controlled and data input controlled discharge path between the emitter and a second supply voltage node; and a clock-controlled feedback path from the data output to the base of the bipolar transistor.

2. The circuit of claim 1, wherein the discharge path comprises a three-state driver.

3. The circuit of claim 1, wherein:

the latch comprises a pair of inverters cross-coupled via a clock controlled pass-gate;

the feedback path comprises a series arrangement of a further inverter connected to the data output and a further clock-controlled pass-gate connected to the base of the bipolar transistor.

* * * * *